United States Patent [19]
Adams

[11] Patent Number: 5,968,693
[45] Date of Patent: Oct. 19, 1999

[54] LITHOGRAPHY TOOL ADJUSTMENT UTILIZING LATENT IMAGERY

[75] Inventor: Thomas Evans Adams, Emmaus, Pa.

[73] Assignee: Lucent Technologies Inc., Murray Hill, N.J.

[21] Appl. No.: 09/246,512

[22] Filed: Feb. 9, 1999

Related U.S. Application Data

[62] Division of application No. 08/669,859, Jun. 26, 1996, which is a continuation of application No. 08/283,240, Jul. 29, 1994, abandoned, which is a division of application No. 08/045,346, Apr. 7, 1993, Pat. No. 5,362,585, which is a continuation of application No. 07/664,187, Mar. 4, 1991, abandoned.

[51] Int. Cl.$^6$ .................................................... G03F 9/00
[52] U.S. Cl. ................................................................ 430/30
[58] Field of Search ................................ 430/22, 30, 311

[56] References Cited

U.S. PATENT DOCUMENTS

| | | | |
|---|---|---|---|
| 4,092,164 | 5/1978 | Crosby | 430/30 |
| 4,474,864 | 10/1984 | Chow et al. | |
| 4,569,717 | 2/1986 | Ohgami | 430/30 |
| 4,640,619 | 2/1987 | Edmark, III | 356/372 |
| 4,741,622 | 5/1988 | Suwa et al. | 356/401 |
| 4,982,226 | 1/1991 | Takahashi | |
| 5,124,216 | 6/1992 | Giapis et al. | |
| 5,674,652 | 10/1997 | Bishop et al. | |

FOREIGN PATENT DOCUMENTS

| | | |
|---|---|---|
| 338200 | 10/1989 | European Pat. Off. |
| 238836 | 11/1985 | Japan |
| 114529 | 6/1986 | Japan |
| 201427 | 9/1986 | Japan |
| 293877 | 12/1990 | Japan |
| 676395 | 1/1991 | Switzerland |

OTHER PUBLICATIONS

Mack: "Photoresist Process Optimization" KTI Microelectronics Seminar Interface 87 (1987) pp. 153–167.

European Search Report dated May 14, 1992, with Application No. 89102186.7 filed Sep. 2, 1989, and German patent 676395 issued Jan. 15, 1991.

"Executing Focus Jobs," DFAS/Metrology System Operation Manual, GCA Corporation, Dec. 1988, pp. 33–44.

"Section 4–Local Alignment Systems," Reticle Handbook, GCA, Apr. 1990, pp. 4–1–4–6.

"Consistent Image Quality in a High Performance Stepper Environment," K. Hale et al., Proceedings, Interface '86, Eastman Kodak Company, Nov. 20–21, 1986, pp. 29–46.

"Understanding focus effects in submicron optical lithography, part 2: Photoresist effects," C.A. Mack et al., SPIE vol. 1088, Optical/Laser Microlithography II (1989), pp. 304–323.

"Characterization of stepper–Lens Aberration and Critical Dimension Control," P. Chien et al., SPIE vol. 538, Optical Microlithography IV (1985), pp. 197–206.

"Stepper overlay calibration using alignment to a latent image," K. W. Edmark et al., SPIE vol. 538, Optical Microlithography IV (1985), pp. 91–101.

"Dark Field Technology–a practical approach to local alignment," D. R. Beaulieu et al., SPIE vol. 772, Optical Microlithography VI (1987), pp. 142–149.

*Primary Examiner*—Christopher G. Young

[57] ABSTRACT

A method to achieve good stepper focus and exposure over an entire wafer for a particular mask level before the start of a product run is described. This method can also be used to produce a characterization of lens field curvature (i.e., a surface of optimum focus across the lens) and to characterize lens astigmatism, defocus sensitivity, relative resolution, and other characteristics, and to check the stepper for optical column tilt. The process prevents the complexities of resist development from affecting determination of focus. The process involves forming an array of latent images in a resist and examining the scattered light from the edges of the latent images. Analysis of the scattered light quickly provides information on correct exposure and focus together with lens characteristics over the printing field.

11 Claims, 11 Drawing Sheets

LITHOGRAPHY TOOL ADJUSTMENT UTILIZING LATENT IMAGERY

This application is a divisional of U.S. application Ser. No. 08/669,859, filed on Jun. 26, 1996, which is a continuation of application Ser. No. 08/283,240 filed Jul. 29, 1994, abandoned which is a division of application Ser. No. 08/045,346 filed Apr. 7, 1993, now U.S. Pat. No. 5,362,585, which is a continuation of application Ser. No. 07/664,187 filed Mar. 4, 1991 abandoned.

TECHNICAL FIELD

The present invention relates somewhat generally the production of latent photographic images in resist materials and includes the equipment and processes used. Somewhat more particularly, it also relates to methods of semiconductor integrated circuit fabrication which advantageously utilize latent images produced in resist-type materials. It also relates to the design of lithography equipment utilizing latent images.

BACKGROUND OF THE INVENTION

The following paragraphs include a general discussion of lithography, an explanation of latent imagery, and some discussion of the methods (including latent image measurements) that lithographers use to determine whether their processes are working properly.

Many modern semiconductor fabrication processes involve the deposition of a photosensitive resist material upon a substrate such as a wafer (which may have various material layers formed upon it). The resist material is then exposed to radiation of a particular frequency (or to particles) through a reticle. The radiation interacts with the resist material and produces a pattern which may be considered a three-dimensional distribution of chemical species within the resist. This three-dimensional distribution within the resist is termed a "latent image." Generally speaking, there is desirably a strong correlation between any horizontal (i.e., parallel to the plane of the substrate or wafer) cross-section through the resist material and the image (as spatially filtered by a lens) that the reticle was designed to generate.

In typical semiconductor processing, the resist material containing these latent images may be processed through a number of subsequent steps, and either the exposed or unexposed portion of the resist material is then removed using either wet or dry techniques. (Whether the exposed or unexposed material is removed depends on whether the resist is a "positive" or "negative" resist.) Typical subsequent semiconductor processing often involves steps, such as etching, ion implantation, or chemical modification of the substrate material from which the photoresist has been removed.

The faithfulness of the three-dimensional resist feature (i.e., the latent image formed by the processes mentioned above) in replicating what is desired by the process engineer is controlled by a large number of variables. It is the task of the lithographer to maximize this faithfulness by judicious equipment selection, and adjustment, and definition of usable process windows.

The metrics used by those versed in the art for characterizing the faithfulness of resist feature formation have been the subject of a number of journal articles. In the article, Mack et al., "Understanding Focus Effects In Submicron Optical Lithography, Part 2, Photoresist Defects," SPIE Vol. 1088 (1989), the authors discuss the interaction of the aerial image (i.e., the three-dimensional image in free space) with the photoresist and model the interaction mathematically to determine what features of the aerial image are important in determining lithographic performance. In addition, the publication: Mack, "Photoresist Process Optimization," KTI Microelectronics Seminar Interface 87 (1987), pp. 153–167, discusses various factors which affect the shape of the latent image.

The majority of current practices regarding characterization of faithfulness of the lithographic process to that desired by the process engineer falls into three categories:

i) quantitative measurement of linewidth in etched layers under varying conditions of exposure and focus, ii) semiquantitative characterization by manual observation (using optical observation or some form of SEM) of features formed under varying conditions, iii) direct interrogation of the aerial image by scanned slits or image dissecting artifacts.

Some of these will be discussed in more detail.

Practitioners have consistently sought various methods for monitoring the accuracy of the process of transferring the reticle pattern into raised or recessed features on the substrate (i.e., a wafer or various material layers upon it). Since the process involves many steps, it is desirable to analyze and understand each step individually. For example, it is axiomatic that the latent image be as faithful a reproduction of the intended portions of the reticle pattern as possible in order to eventually produce acceptable semiconductor features such as lines, spaces, etc. To evaluate the faithfulness, in the past, practitioners have frequently created latent image lines in photoresist, developed these lines and then etched the line patterns into the underlying substrates of test wafers. Then these test wafers were sectioned and subjected to SEM analysis. The linewidths in the SEM were then measured and compared with the desired linewidth. Unfortunately this monitoring process introduces many additional variables and possible sources of inaccuracy. For example, the developing process, the etching process, and the SEM measurement process may all contribute to inaccuracies in the comparison between the final etched line and the desired reticle "standard." (Experienced practitioners will also realize that the above procedure may be complicated by etching proximity effects.)

Another technique used to evaluate the adequacy of lithographic processes is to expose the photoresist (to radiation projected from a reticle pattern) thus creating a latent image, and then develop the photoresist. The developed photoresist will exhibit a series of raised features which may be examined and compared with the intended design pattern on the reticle. For example, the developed features may be evaluated by SEM, typically using either high accelerating voltages and conductive coatings on the features or low accelerating voltages coupled with tilted substrate surfaces. The developed features may also be observed and measured optically.

Two factors (characteristic parameters) which are among those that are very important in lithographic processes (and are normally adjusted on a routine basis) are the focus and exposure dose ("fluence") of the stepper or other tool used to produce latent (and then developed) images. Either poor focus or poor exposure dose will create latent images with poorly defined edge profiles and, therefore, ultimately will cause poorly defined edge profiles or unacceptable width variations on etched features or implanted regions. (For example, an exposure dose that is too low provides insufficient energy to induce adequate chemical change in the resist.) Good focus and exposure are often determined experimentally by the following procedure. Either focus or exposure dose is held constant while the other is varied during a series of exposures in which sets of lines and spaces are created in the photoresist. Measurements of the linewidth deviation from nominal of either the developed photoresist image or an etched feature are graphically plotted with the variable focus or exposure dose to determine, for example, best focus for a constant exposure dose. The graphical technique often produces curves which, because of their contours, are sometimes called "smile plots."

Recently, one stepper manufacturer has utilized latent imagery in an attempt to determine proper stepper focus. The procedure is as follows: A flat, resist-coated wafer is put in the stepper. A row of approximately 40 local alignment mark features is sequentially exposed in a straight line proceeding horizontally across the entire wafer. The exposure dose is maintained constant while focus is varied for each alignment mark location. Thus a sequence of latent images is created in the photoresist. Each alignment mark consists of several groups of horizontal and vertical lines which are rectangular in shape and which are normally used to provide an "X" and a "Y" (or "horizontal" and "vertical") alignment reading. The stepper is then programmed to move the wafer containing the latent images of these alignment marks to a position under its local alignment optics. An alignment is performed at each location and the signal contrast for the X and Y alignments is measured and stored for each alignment mark location. The data is analyzed in an effort to determine proper focus.

It may be noted that in the normal operation of the stepper's local alignment system the scattered light signal from the edges of a developed or etched alignment mark is measured as the mark is scanned in X and Y coordinates under the system's illuminating reference beams. (These beams are arranged in shape, spacing and orientation so that they will match the edges of alignment marks.) (The term "scattered light" is used here to indicate light which returns along a path different from that followed by reflected or transmitted light. Because the optics are arranged to observe only the scattered light, the system performs as a dark field microscope and is termed a "dark field alignment system.") However, in the practice described above, the procedure is performed upon a latent image.

After an image scattering signal for the X and Y (i.e., horizontal and vertical) alignment of each alignment mark is measured, a "contrast" number for the X and Y alignment of each alignment mark is determined. The "contrast" is given for the X and Y alignment of each alignment mark as $$K_{i,X,Y} = \frac{Imax - Imin}{Imax} \quad \text{1)}$$

where $K_{i,X,Y}$ is the contrast for the $i^{th}$ alignment mark for X or Y, i=1 . . . 40

Imax is the maximum intensity of the scattered signal from the $i^{th}$ alignment mark in the X or Y dimension Imin is the minimum intensity of the scattered signal from the $i^{th}$ alignment mark in the X or Y dimension.

The X and Y data (i.e., $K_{iX}$ and $K_{iY}$ for each alignment mark on the wafer) are combined (i.e., averaged) to provide an average contrast for each alignment mark. The average contrast for each alignment mark is plotted against mark X-Y location (i.e., the focus used for each mark exposure). The maximum for the latent image alignment contrast curve thus obtained is used as a reference focus to be chosen as "machine focus" for the stepper. "Machine focus" is an average reference focus which will be discussed in further detail below.

SUMMARY OF THE INVENTION

Applicant has discovered that the latent image based machine focus determination procedure described above suffers from several disadvantages. The format of the previously described technique for determining machine focus requires the stepper to attempt to locally align (in horizontal and vertical directions—the terms X,Y and horizontal, vertical are used interchangeably herein) to a single row of approximately 40 locations across the face of the wafer and may produce machine focus with somewhat inaccurate results. Should there be small defects on the wafer surface which are less than the focus tracking beam width but of the same or larger size than one or more alignment features within an alignment mark, or if there are irregularities in the stepper chuck, an inadvertent latent image defocus (leading to an inaccurate machine focus determination) will result, or a portion of the latent image may be degraded.

The previously described format is also not generally amenable to choosing proper focus over actual product wafers.

The previously described technique, furthermore, does not provide a method by which one can detect print field curvature.

In addition, the present prior art technique uses a fixed array of alignment marks of relatively constant width occupying approximately 140 $\mu m^2$ area. There is no provision in this technique for varying the linewidth of the alignment marks. Consequently, resolution measurements cannot be made which include the effects due to varying linewidth or neighboring features.

In addition, the previously described technique does not permit one to measure the defocus sensitivity of the lens over various parts of the printing field for various features, geometries, or orientations.

The present invention addresses one or more of the above problems in an embodiment which includes providing a substrate having a resist; creating a plurality of latent images in the resist, each image being characterized by at least one lithographic parameter, interrogating the latent images and utilizing the results of the interrogation to form additional latent images. The additional latent images may be subsequently developed and the developed images used as a mask to etch, etc., an underlying layer as a part of a semiconductor fabrication process. Examples of lithographic parameters which may characterize a latent image are focus and exposure. Thus, the invention includes a method for choosing proper focus and/or exposure over product wafers.

In another embodiment, the invention includes providing a lithographic tool with a lens and creating latent images in a resist; the latent images are interrogated and the lens is adjusted. For example, in various embodiments, interrogation of the latent images may lead to determination of lens parameters such as astigmatism, defocus sensitivity, depth of focus, resolution, field curvature, spherical aberration, coma, or other aberrations. The lens system may be adjusted or the stepper adjusted by various means known to those skilled in the art to improve these parameters.

In other embodiments, the interrogation may provide a way of characterizing several lithography tools according to the above parameters. Then the tool with the best resolution, for example, may be selected for certain semiconductor process levels (to the exclusion of other tools).

A few of the advantages of the invention are: it provides a fast method for determining focus and exposure over semiconductor wafer in process at various process levels.

The invention also provides a fast quantitative way of determining lens parameters and using them to improve lithography tools. The invention also provides a quantitative way of rank-ordering various steppers so that the "best" may be used at the most critical semiconductor process levels.

A further illustrative embodiment of the invention includes the formation of latent images in full field arrays, which are two-dimensional arrays in a printing field (as opposed to one-dimensional rows in current practice). Illustratively, a full field array contains a matrix of locations in the printing field. Interrogation of latent images at appropriate full field locations is useful in determining lens parameters and lithographic parameters above.

A further illustrative embodiment of the invention includes a method of interrogating latent images which includes forming latent images having at least a first and second dimension. The latent image is exposed to a static energy source which impinges upon the first dimension and not the second dimension. Illustratively, the latent images are rectangles and the energy is a beam which contacts only the lengths of the rectangles. The technique provides latent image data which is free of end defect distortions and noise caused by beam scanning (both of which are problems with currently practiced techniques).

DETAILED DESCRIPTION

Figure 1:
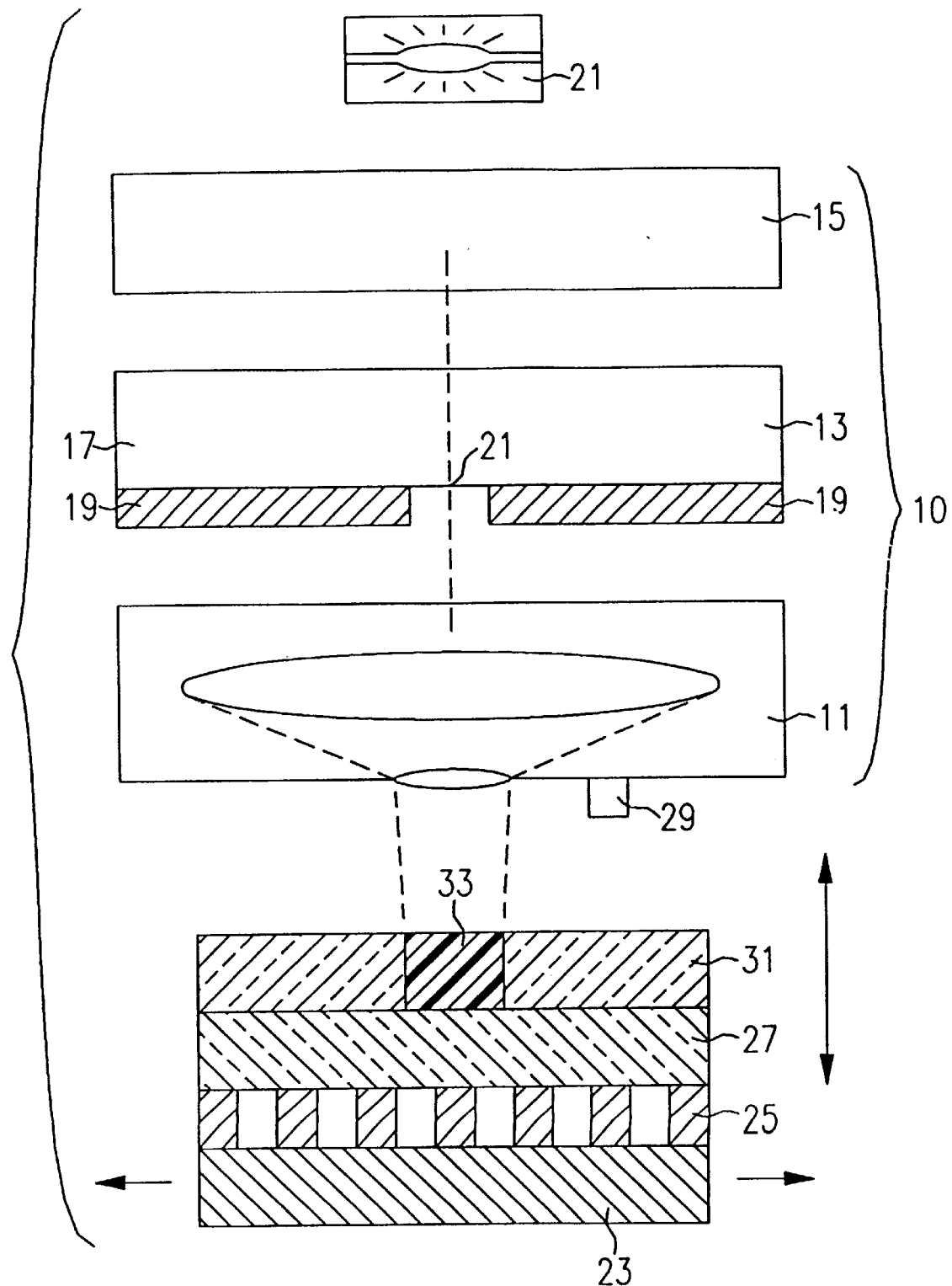
FIG. 1 is a schematic view of a lithography tool.

FIG. 1 depicts in schematic form the essential components of, and operation of a lithographic stepper. Reference numeral 11 denotes generally a multi-element reduction lens system simply termed a "lens" herein. Reference numeral 13 denotes a conventional reticle which includes an optically transparent plate 17 (often quartz or glass) coated with or containing an opaque layer 19 (often chrome). One or more openings 21 are defined in the opaque layer(s) 19. Above reticle 13 is an illuminator system normally containing a condenser lens indicated schematically by box 15. A light or radiation source 21 is positioned generally above the condenser lens 15. (Alternatively, other methods for exposing the resist such as e-beam, ion beam, or x-ray may be utilized. The equipment for these methods may, of course, be different.) Methods for supporting the various components described above are well known and thus have not been shown in the figure and, furthermore, those components not essential to an understanding of the invention have not been illustrated.

Positioned generally beneath stepper lens system 10 is mechanical stage 23. The chuck on stage 23 may have a multiplicity of upward protruding fingers 25 which support wafer 27. The details of wafer 27 are not apparent from the figure. Wafer 27 may include bare silicon (or other substrate material) or a substrate, possibly silicon, with devices formed upon it, and possibly with overlying layers of dielectrics such as silicon dioxide, silicon nitride, etc. Possibly, wafer 27 may have a layer of conductive material, for example metal or polysilicon. Reference numeral 31 denotes a photoresist which has been deposited in a uniform thickness upon wafer 27. A portion of photoresist 31 designated by reference numeral 33 has been exposed. In general terms, exposed portion 33 corresponds to opening 21 in reticle 13.

Apparatus 29, a dark field microscope and illuminator which may be located in the general vicinity of reduction lens 11, is utilized to measure the intensity of light scattered from the interface region between the exposed portion 33 and the unexposed region 31. The process of measuring energy scattered from the latent image "edge" is called "interrogation." (Alternatively apparatus 29 may be located above reticle 13.) If desired, an optical instrument independent of the stepper may be used to perform measurements. A variety of other equipments may be used to detect the change in optical thickness at the interface between exposed portion 33 and unexposed portion 31; for example, a phase contrast microscope, an optical diffractometer, a coherence probe microscope, a near field optical microscope, a polarization sensitive microscope, or a scanning confocal microscope (adapted to receive scattered light).

Machine Focus

In one illustrative embodiment of this invention the proper machine focus for a lithography tool may be determined. The following paragraphs will describe how the above-detailed apparatus may be utilized to determine proper machine focus. "Machine focus" in a manufacturing process is an independent reference focus for a selected substrate and resist. Generally practitioners customarily establish "machine focus" at regular intervals of time for semiconductor manufacturing lines.

The machine focus is the benchmark focus usually chosen over bare silicon with photoresist on top. Under ideal circumstances the machine focus may be modified, depending upon the process layers built up on the wafer. Other factors may also contribute to deviations from machine focus in actual wafer processing. Some of these will be discussed later. Ideally, process dependence may be compensated for by simple fixed shifts from machine focus.

Figure 2:
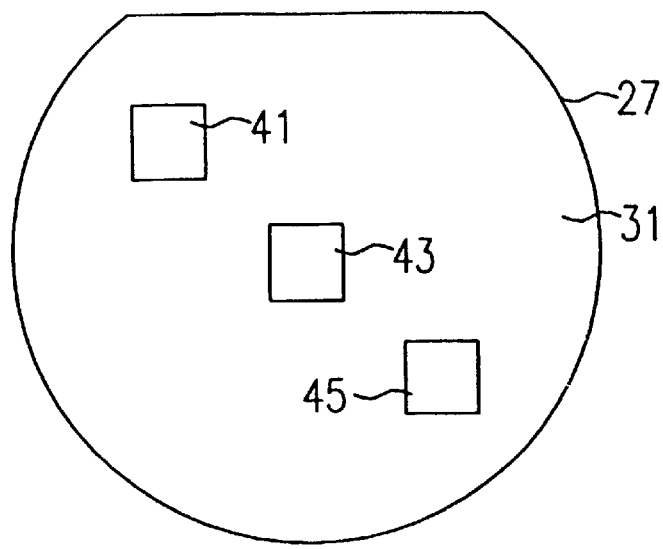
FIGS. 2 and 3 are diagrams useful in understanding latent image placement and arrangement upon a wafer.
Figure 3:
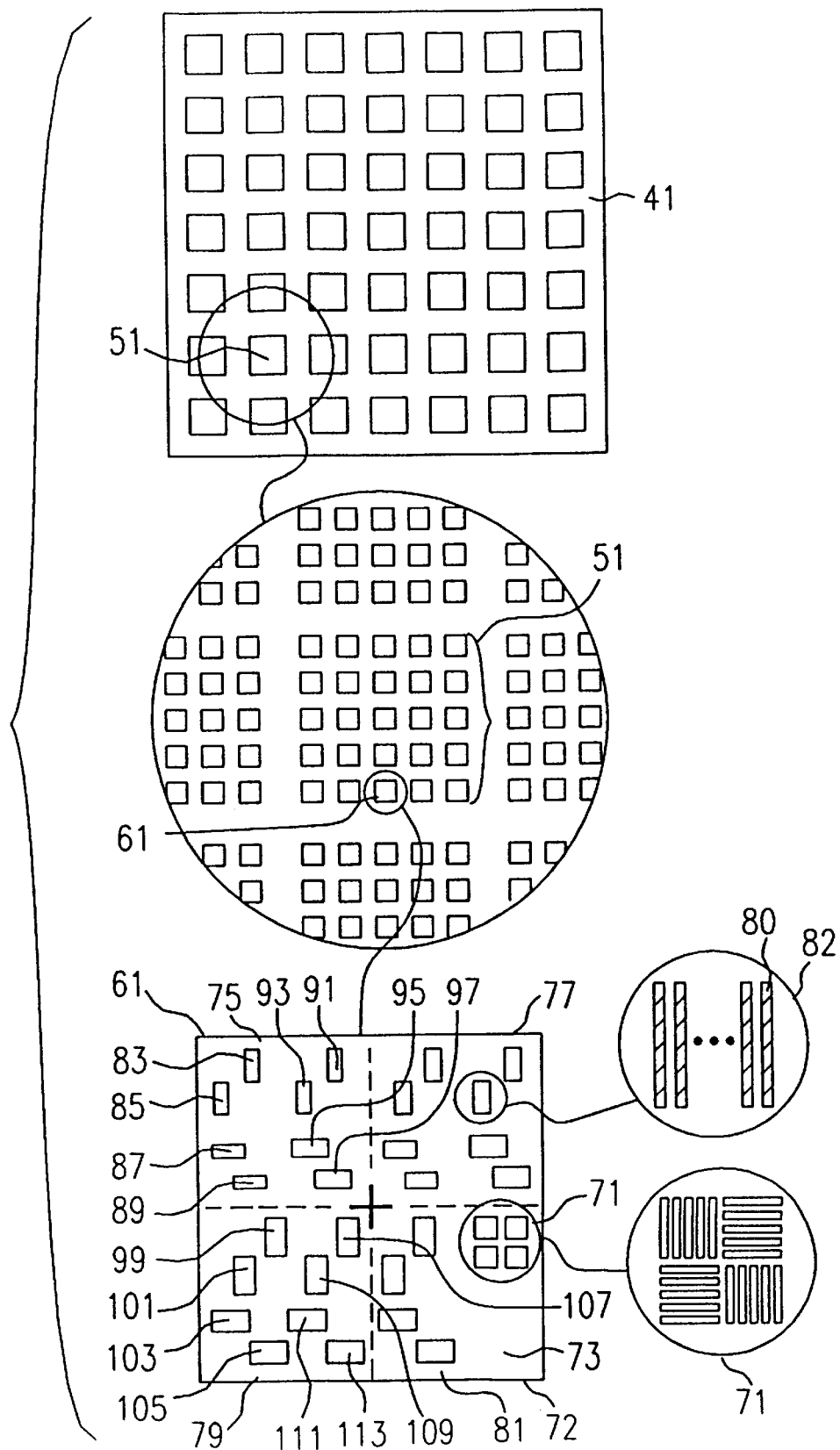

A reticle 13 with suitable features arranged in feature clumps (61) as shown in FIG. 3, which are positioned at a number of locations on the reticle (perhaps 7 rows by 7 columns) is loaded in the stepper. Next a resist-coated wafer 27 is loaded onto the stepper chuck 23. Then several sets of full field patterns also termed "focus arrays" (for example three sets 41, 43, and 45 (FIG. 2)) are created on the wafer. Each full field pattern 41, 43, and 45 is obtained by utilizing a printing field which is filled with, for example, a 7×7 matrix of sub field arrays 51 shown in FIG. 3. (By contrast, previous techniques use a series of wafer local alignment features created from a single point in the printing field.) In the present technique, each sub field array 51 is created by microstepping the stepper to create, for example, a 4×4, or 5×5, etc. array 51 of feature clumps 61, in FIG. 3. As will be described in further detail below, various feature clumps will be created at different exposure doses or different focus offsets so that analysis of the resulting latent images will provide means for evaluating lithographic parameters such as focus and exposure and lens system parameters such as astigmatism, field curvature, coma, lens resolution, etc.

Returning to the determination of machine focus, each of the sub field arrays 51 is simultaneously created by boustrophedonically microstepping (or possibly utilizing some other exposure sequence) the stepper to create, for example, a 4×4 array (i.e., 16 total) of individual feature groups 61 in the resist. The stepper focus is changed slightly by a known amount to create each of the 16 feature clumps 61.

Thus, in a typical application three full field patterns 41 are created in the resist on the wafer. Each full field pattern contains a 7×7 matrix of sub field arrays 51. Each sub field array 51 contains a 4×4 matrix of feature clumps 61. Each feature group is produced at a slightly different focus. Generally (though not necessarily) corresponding feature clumps 61 within full field patterns 41, 43, 45 are characterized by the same focus.

In practice, each feature clump 61 may contain a standard local alignment mark 71 (often used in commercially available steppers). (The alignment mark may be eliminated if desired.) In addition, each feature clump contains an exposed, but unmodulated region 73. Examination of FIG. 3 shows that the feature clump may be divided for convenience into four quadrants 75, 77, 79, 81. The upper left quadrant 75 contains four feature groups of vertically oriented lines and four groups of horizontally oriented lines. Groups 83 and 85 are twenty-one 0.65 μm vertically oriented lines (approximately 64 μm in length). Groups 87 and 89 are twenty-one 0.65 μm horizontally oriented lines. Groups 91 and 93 are twenty-one 0.70 μm vertically oriented lines. Groups 95 and 97 are twenty-one 0.70 μm horizontally oriented lines.

In the lower left-hand quadrant, groups 99 and 101 are twenty-one equally spaced 1.0 μm vertical lines. Groups 103 and 105 are twenty-one 1.0 μm equally spaced horizontal lines. Groups 107 and 109 are eleven (for convenience) equally spaced 2.0 μm vertical lines and groups 111 and 113 are eleven equally spaced 2.0 μm horizontal lines.

The feature clump described in FIG. 3 is advantageous when used with the GCA micro DFAS (dark field alignment system). The micro DFAS has a series of horizontal and vertical beams. To interrogate latent images formed from the feature group in FIG. 3, one positions, for example, the horizontal beam over the latent image corresponding to groups 83 and 85. The feature group is dimensioned so that only groups 83 and 85 are covered by the interrogation beam. Therefore, other groups cannot create a signal which might affect the measured intensity of the scattered light obtained from groups 83 and 85. Thus the modulation of the resist characteristic of, for example, 0.65 μm lines and spaces, may be measured without fear of involvement with 0.70 μm lines. Also, of course, the interrogation beam may be placed on edge 72 to measure modulation due, essentially to a step function. Other marks may equally well be chosen and other print field array arrangements may also be chosen. The interrogation beam is not scanned.

Figure 14:
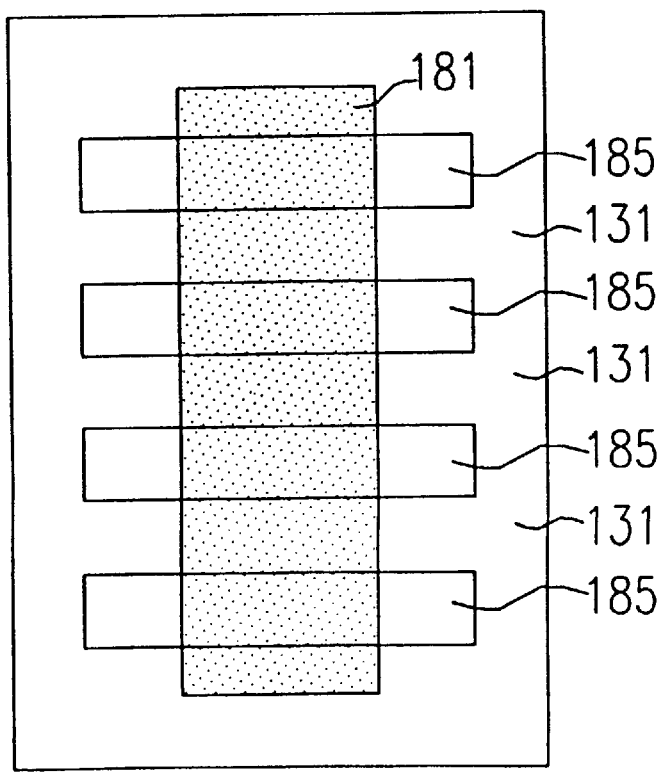
FIG. 14 is a diagram illustrating a relationship between an interrogation beam and a series of latent images.

Another illustrative embodiment of the present invention includes the interrogation of latent images. FIG. 14 is a diagram which assists in understanding how the interrogation beam is statically placed with respect to latent images. Reference numeral 185 denotes some individual latent images in a feature group such as 83, 85. Reference numeral 131 denotes spaces between images 185. Beam 181 is statically positioned so that it traverses all latent images in a feature group. Multiple beams may be used. However, beam 181 does not cover the outer ends of any of the images 185. The beam 181 does not cover the ends, because the ends have different imaging properties than the central portions of the lines. The scattering properties of the ends are also different than the central portions.

Although beam 181 is illustrated in FIG. 14 as having a sharply defined edge, in actuality, the edge intensity has a smooth transition from zero to full intensity. Static placement of beam 181 across latent images 185 yields a satisfactory scattered signal. (By comparison, one current manufacturer scans a beam across a series of latent images producing a complex signal not easily amenable to analysis.)

As mentioned before, the length of features 185 is approximately 64 μm, while their width may vary (depending upon what feature group is chosen), for example, from 0.35 μm to 6.0 μm. The width of beam 181 is approximately 2.0 μm, while its length is approximately 51 μm.

Figure 13:
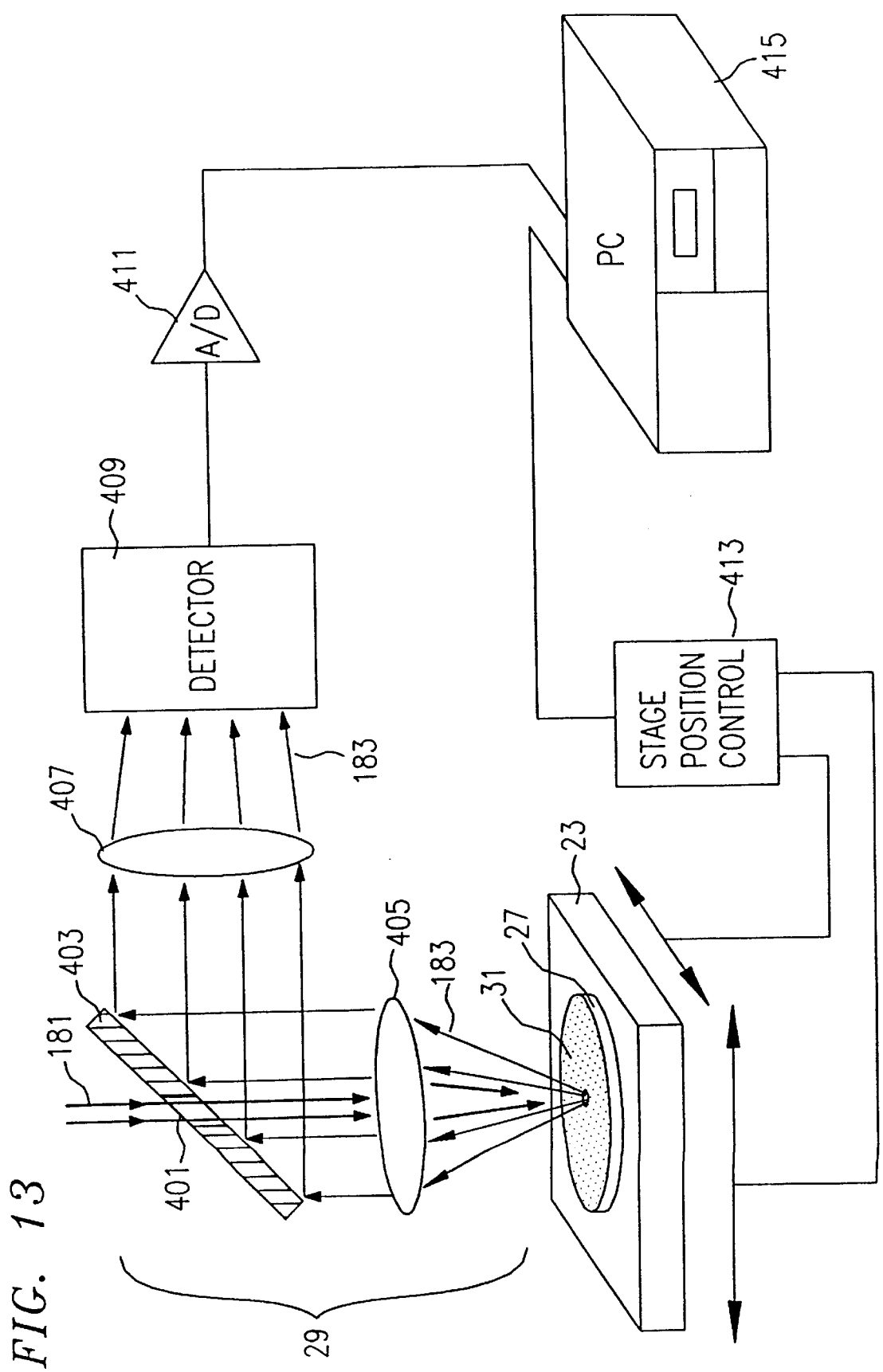
FIG. 13 is a diagram illustrating latent image measurement apparatus.

FIG. 13 is a schematic diagram of a system for latent image measurements. Wafer 27 with resist 31 is positioned, as mentioned before, on stage 23. Illumination 181 passes through hole 401 in mirror 403 and through focusing lens 405 to illuminate latent images. Scattered light 183 is reflected from mirror 403 through lens 407 to detector 409, wherein it is converted to an electrical signal and transmitted to A/D converter 411. Stage position control 413 controls movement of stage 23. Both stage movement and data analysis may be performed by computer 415.

In FIG. 3, the pitch between individual elements 51 in the full field pattern is approximately 2.5 mm. The distance between individual feature clumps 61 in the sub field array is approximately 480 μm. The dimensions of the alignment mark 71 are approximately 140 μm×140 μm. The length of each individual feature in mark 71 is approximately 60 μm while the width is 6 μm. The length of each feature 80 is 64 μm.

At each of locations 41, 43, 45, a selected number of sub field arrays (possibly the nine most central arrays, although others may be chosen depending upon one's suppositions about lens astigmatism or column tilt) is chosen. For each sub field array, group or groups of features within a feature clump are chosen. For example, feature groups 85 and 83 may be chosen.

Figure 4:
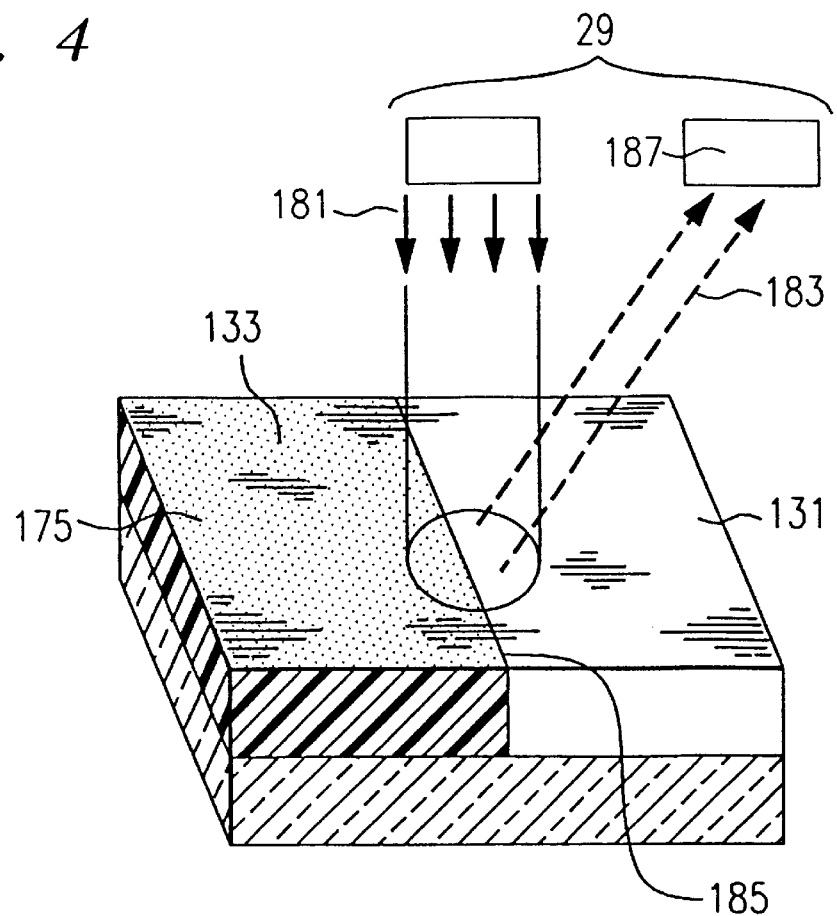
FIGS. 4 and 5 are perspective views which schematically illustrate interrogation of latent images.

Turning to FIG. 4, the illumination and examination of an individual latent image corresponding to a feature group will be described in general. An interrogation beam 181 (which may be the local alignment system's alignment beam—mentioned above—which consists of a series of line-shaped images designed to fit with the edges of a GCA local alignment mark) or a beam of desired shape is positioned directly onto the latent image 133 of feature group or a portion of feature group 83. (The spatial size of beam 181 may be smaller or larger than the size of the latent image 133.) Typically, incident radiation 181 may be broad or narrow band illumination which has preferably been properly filtered so that it does not induce photochemical reactions in resist material 131 during measurement. However, monochromatic light may also be used. It is, however, generally desirable that whatever light 181 is used that it not induce the aforementioned photochemical reaction. The width of an individual line image of beam 181 in the GCA local alignment system example, at the surface of resist 131 is approximately 2 μm, although other widths or shapes may be used. Scattered light beam 183 from edge 185 of latent image 133 is collected by detector 187. To speak more precisely, there is no clearly defined edge 185 of the latent image. The term edge is used loosely to refer to the transition between the bleached and unbleached portions of the photoresist. The present inventive technique provides one with a method of quantifying how "sharp" edge 185 may be. That is, the gradient of the photoactive compound may be measured with the present technique. Other techniques for measuring the scattered light may also be used. For example, a two-dimensional detector array or a scanned detector, both of which provide positional intensity information, may be used to spatially resolve the light from the latent image.

Figure 5:
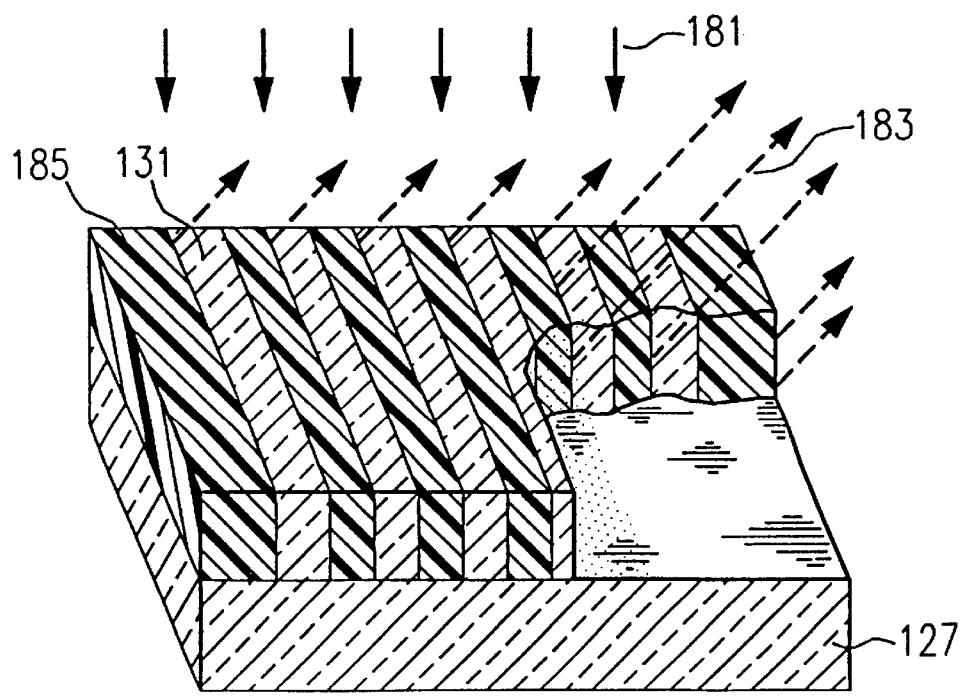

If desired, a series of similar latent images, as shown in FIG. 5, may simultaneously be interrogated. In FIG. 5 a series of latent images 185 are created in resist 131 upon substrate 127. All of the latent images are illuminated simultaneously by beam 181 and the scattered light 183 from all of the images is measured. Preferably, the illumination is performed as illustrated in FIG. 14.

The maximum intensity of the fraction of the scattered light that reaches the detector 187 is measured and may be termed Imax in equation 2 below. If a contrast background level compensated signal strength is desired, the interrogation beam may be placed above an unmodulated portion of the photoresist, such as the portion corresponding to region 73 in FIG. 3 and the intensity of the scattered light reaching the detector measured as Imin.

$$K_{i,\theta} = \frac{Imax - Imin}{Imax + Imin} \quad 2)$$

i=1 ... n
θ=H,V

If the background signal is extremely low (as it often is), it may be ignored (or subtracted away), and equation 3 used:

$$K_{i,\theta} = Imax \quad 3)$$

i=1 ... n
θ=H,V

Then, a signal strength $K_{iH}$ and $K_{iV}$ in may be calculated according to equation 2 or 3.

Then, another feature group 82 within feature clump 61 is selected either $K_{iH}$ or $K_{iV}$ are calculated for that feature group 82 also. Generally, in current practice a total of approximately 13 or 16 or more feature groups 82 within a sub field array 51 may be selected and the values $K_{iH}$ or $K_{iV}$ calculated for each.

The stepper focus for each feature clump 61 within a sub field array 51 was set at a different focus offset. Consequently, the focus corresponding to each $K_{iH}$ or $K_{iV}$ for each of the feature groups 82 is known (to a given uncertainty). The uncertainty in each focus is, of course, caused by the errors in the stepper focus tracking system, flatness of the wafer, flatness of the chuck, and other miscellaneous factors.

Figure 6:
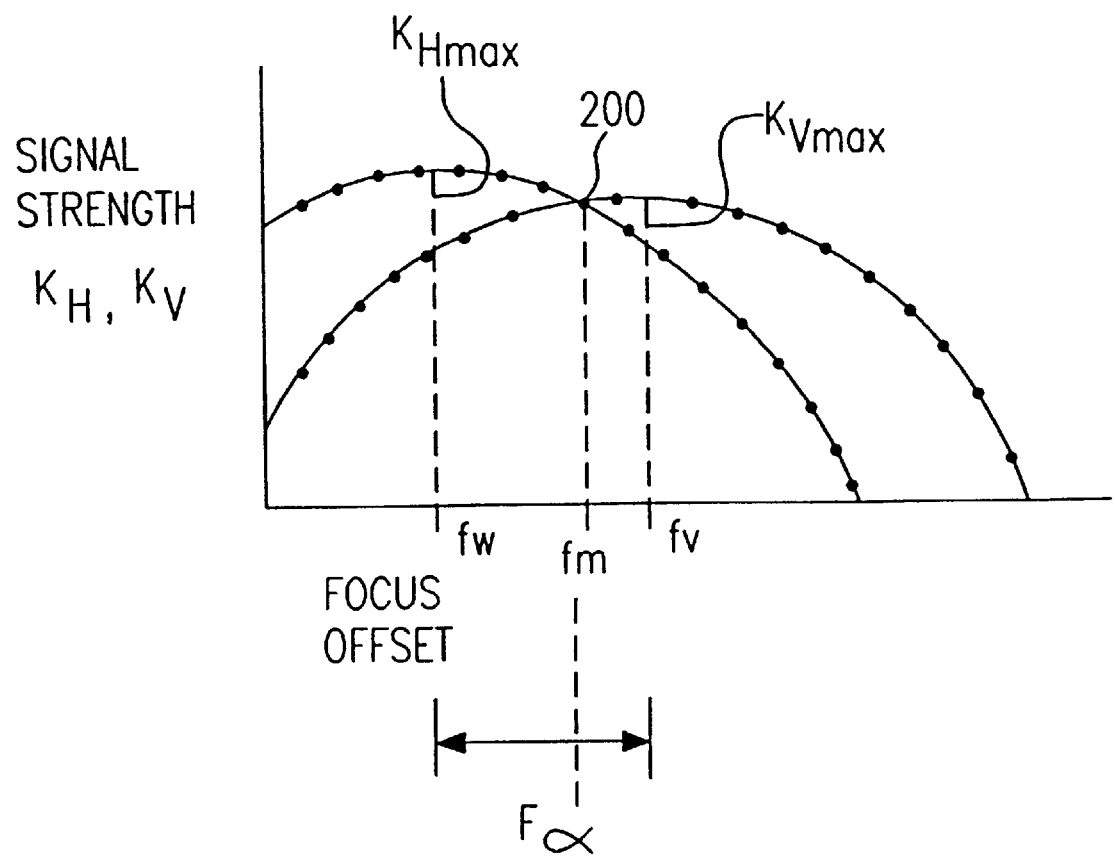
FIGS. 6, 7, 8, 9, 10, 11, and 12 are graphs which aid in understanding various aspects of the invention.

Then each of the values obtained for signal strength $K_{iH,V}$ is least-squares-fitted against its corresponding focus. (Each feature group 82 therefore corresponds to one point on the graph of FIG. 6. In other words, the graph of FIG. 6 may be said to characterize a single sub field array 51 for a chosen constant linewidth in a feature clump 61.) Generally speaking, the second order curve fits well although a higher order curve may be used if desired. FIG. 6 depicts a typical result.

Then in FIG. 6 the maximal values $K_{iH}$ max and $K_{iV}$ max are obtained for each curve. The focus value for these maxima are actually the offsets (i.e., focus offset) from what those skilled in the art term the "Zero Focus" of the stepper. Thus, it can be seen that for both the horizontal and vertical direction a focus number is obtained which produces the maximum signal strength.

It will be noted in FIG. 6 that focus offset values corresponding to the maximal values $K_{iV}$ and $K_{iH}$ are somewhat different. The fact that these two values are different is an indication that the lens exhibits some astigmatism at the particular point in the printing field associated with its respective sub field array.

The present inventive technique possesses an advantage over the previous prior art technique in that the vertical and horizontal data are maintained separate (and data related to functional dependence and maximum values of the signals are retained) so that: 1) quantitative measurement of the astigmatism (in this case, horizontal and vertical components) in the lens may be obtained; 2) both sets of H (horizontal or X) and V (vertical or Y) data may be easily fitted to a second order or higher equation so that the individual focus dependences, as well as information regarding optimum imaging capabilities and defocus sensitivity may be determined as will be explained in further detail below.

The focus values obtained from an analysis of FIG. 6 may be chosen as machine focus. However, these values were obtained by looking only at one relatively small area on the wafer. Because of the possible contributions to error of factors such as chuck flatness, wafer flatness, field curvature of the lens, etc., it is desirable to sample a larger number of locations on the wafer and to calculate a focus value for each of these positions.

For example, it should be noted that in analyzing the sub field arrays, that essentially a single point on the lens is being analyzed. However, the same data should be taken for a selected number of points, typically three to nine points in the 7×7 full field pattern 41. This data will yield an average focus value which will be more representative of the entire lens.

Therefore, for example, approximately three to nine focus curves similar to that in FIG. 6 are obtained from each one of the 7×7 full field patterns 41, 43, and 45. For each pair of curves akin to FIG. 6 selected from a chosen full field pattern, a pair of focus values $f_H$, $f_V$ corresponding to $K_H$ and $K_V$ is obtained. All of the $f_H$ values are averaged to give average machine horizontal focus. All of the $f_V$ values are averaged to give average machine vertical focus, i.e., $$\overline{f_H} = \sum_{i=1}^{n} \frac{f_{Hi}}{n}$$

$$\overline{f_V} = \sum_{i=1}^{n} \frac{f_{Vi}}{n}$$

Then machine focus is given by $$f_M = \frac{\overline{f_H} + \overline{f_V}}{2}$$

for each full field pattern.

Next the averages obtained for each of the full field patterns 41, 43, and 45 are averaged. This produces an average focus for each of locations 41, 43, and 45 on the wafer. This average focus is termed "machine focus."

If machine focus is determined for different frequencies of monochromatic light, the change in machine focus divided by the difference in light frequencies is a chromatic aberration coefficient. The lens may be adjusted to reduce the chromatic aberration coefficient.

In the past, practitioners have often attempted to determine "machine focus" by semiquantitative means which involve subjective-observation of developed photoresist features and the determination that a given set of features is "clear" or "resolved." These methods are subjective (and hence imprecise) as well as slow and difficult to automate. In addition, a large number of variables may affect the final results. Quantitative characterizations have relied, almost universally on linewidth measurements. While linewidth measurements are a critical factor in stepper performance tests, they are difficult to make and process dependent. Furthermore, the definition of linewidth becomes vague when printed lines have changing wall slopes. Thus, linewidth measurements reflect the contributions of the exposure tool (stepper), the photoresist, and all the process steps that follow. The previous process has the further disadvantage in that the latent image is interrogated by scanning a beam of light across it. The scattering data is sampled by an A/D converter. Experience has shown that the data produced by scanning is noisier than data produced by the present inventive technique which involves static illumination of the latent images as described previously.

Furthermore, the present inventive method has advantages over techniques used by at least one stepper manufacturer which involve forming a series of approximately 40 local alignment marks (which occupy only a small portion of a printing field (usually the center), i.e., are not a full field array) spanning a portion of the diameter of the wafer. The manufacturer's technique has the serious disadvantage of ignoring the field curvature of the lens. That is, the entire machine focus determination is based upon data gathered from only one point in the printing field.

The prior technique is restricted to local or "die by die" alignment marks because it utilizes a dark field alignment (DFAS) probe beam which has an illumination pattern that matches the alignment marks. In an illustrative embodiment, the present technique utilizes finer line-space pairs which are more focus dependent, and which produce a larger scattering signal and, therefore, sharper contrast curves, thus permitting more accurate focus determination.

Wafer Flatness

Another illustrative embodiment of the present invention involves determining if the wafer is flat or if there is particulate matter on the chuck, and then subsequent correction of the problem. Interpretation of the data obtained above can provide valuable insights into the operation of the stepper. For example, if the average focus obtained from each of the locations 41, 43, and 45 are all approximately the same, then there is no problem. However, if one of the focus values differs significantly from the other two, it may be an indication that the wafer is not flat or that perhaps there is some particulate matter on the chuck.

Column Tilt

Another illustrative embodiment of the present invention involves determining if the stepper optical column is tilted and subsequent correction of the problem. If the relative focus offsets between the three to nine sub field arrays 51 observed in a given full field array vary with the same approximate difference consistently across each full field array (41, 43, or 45), they may provide an indication that the stepper column is tilted. If they vary from full field array to full field array they may indicate that the wafer or the chuck may be bowed. The aforementioned information is provided by the inventive technique and likely cannot be provided by the previously described technique.

If the focuses obtained for locations 41, 43, and 45 are reasonably consistent, and fall within a reasonable tolerance value, then the average of the three values may be used as the machine focus. If, as mentioned before, some of the data falls outside the realm of acceptability, it is an indication to the operator that he should examine the wafer, the chuck, the column, etc. to determine the source of the error.

Lens Astigmatism

Another illustrative embodiment of the present invention involves a determination of lens astigmatism and subsequent lens adjustment to alleviate the problem, if necessary. The following paragraphs will describe how lens astigmatism may be measured. The procedure will permit one to evaluate optimum focus for both vertical and horizontal feature orientations (or for any desired orientations) and to intelligently make a trade-off between them. In general terms, in order to evaluate lens astigmatism over the printing field, it is desirable to select a comparatively large number of points (i.e., sub field arrays) in a full field array, for example 49 points. For each sub field array the contrast for horizontal and vertical feature groups are determined as a function of focus in a manner analogous to that just described. Consequently, for each point in the printing field (i.e., for each sub field array in the full field array) curves analogous to those depicted in FIG. 6 are obtained. The curves indicate for both horizontal and vertical features, the signal strength as a function of focus. For each selected point in the printing field, the lens astigmatism is the relative offset in optimum focus for features of different orientations. For example, in the graph of FIG. 6, the astigmatism is represented by the quantity $F_\alpha$.

Consequently, local astigmatism may be evaluated by creating a curve analogous to that in FIG. 6 for each of the selected points in a printing field. The data may be improved by printing several full field arrays and averaging the data.

Field Curvature

Figure 7:
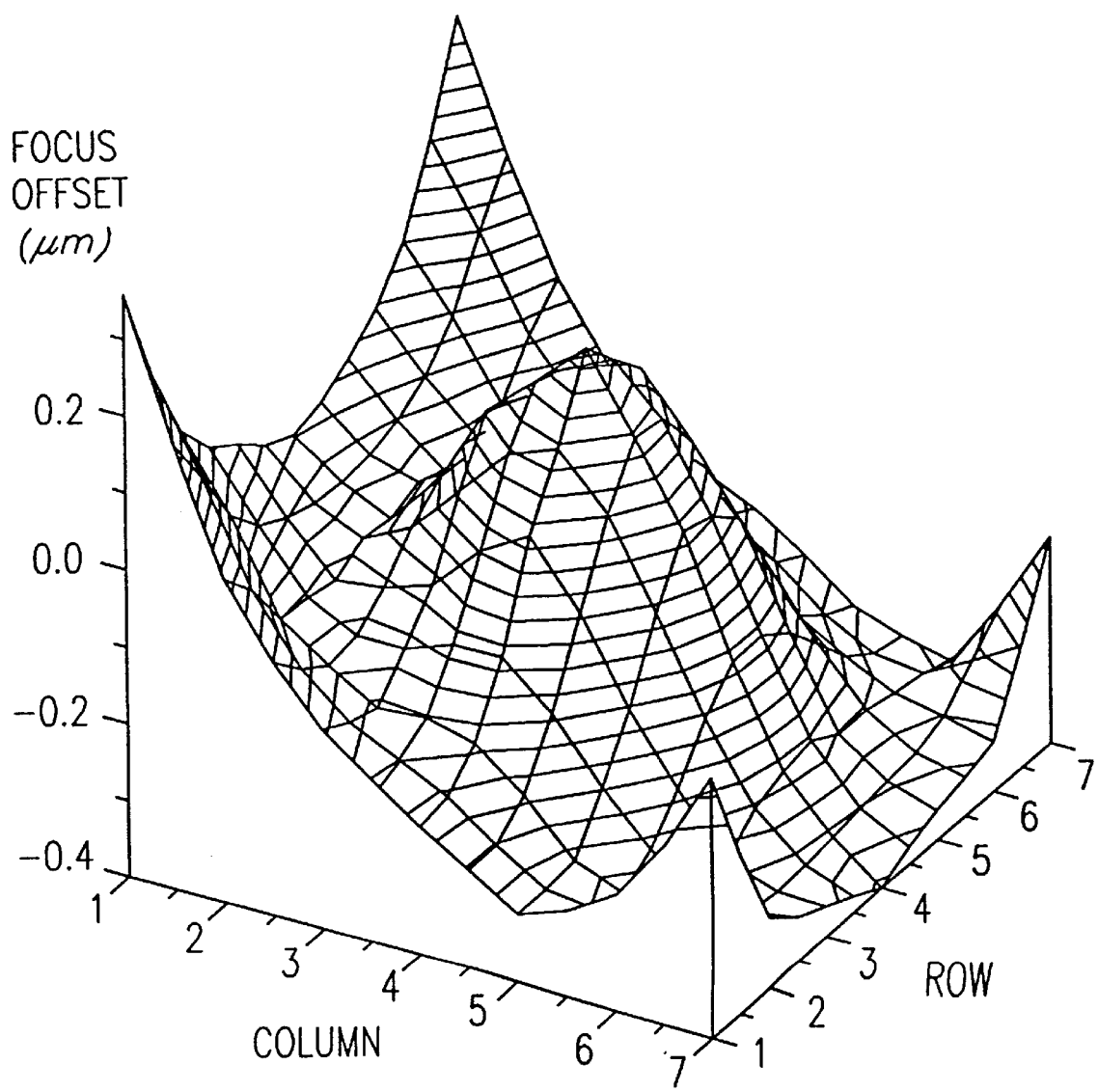
Figure 12:
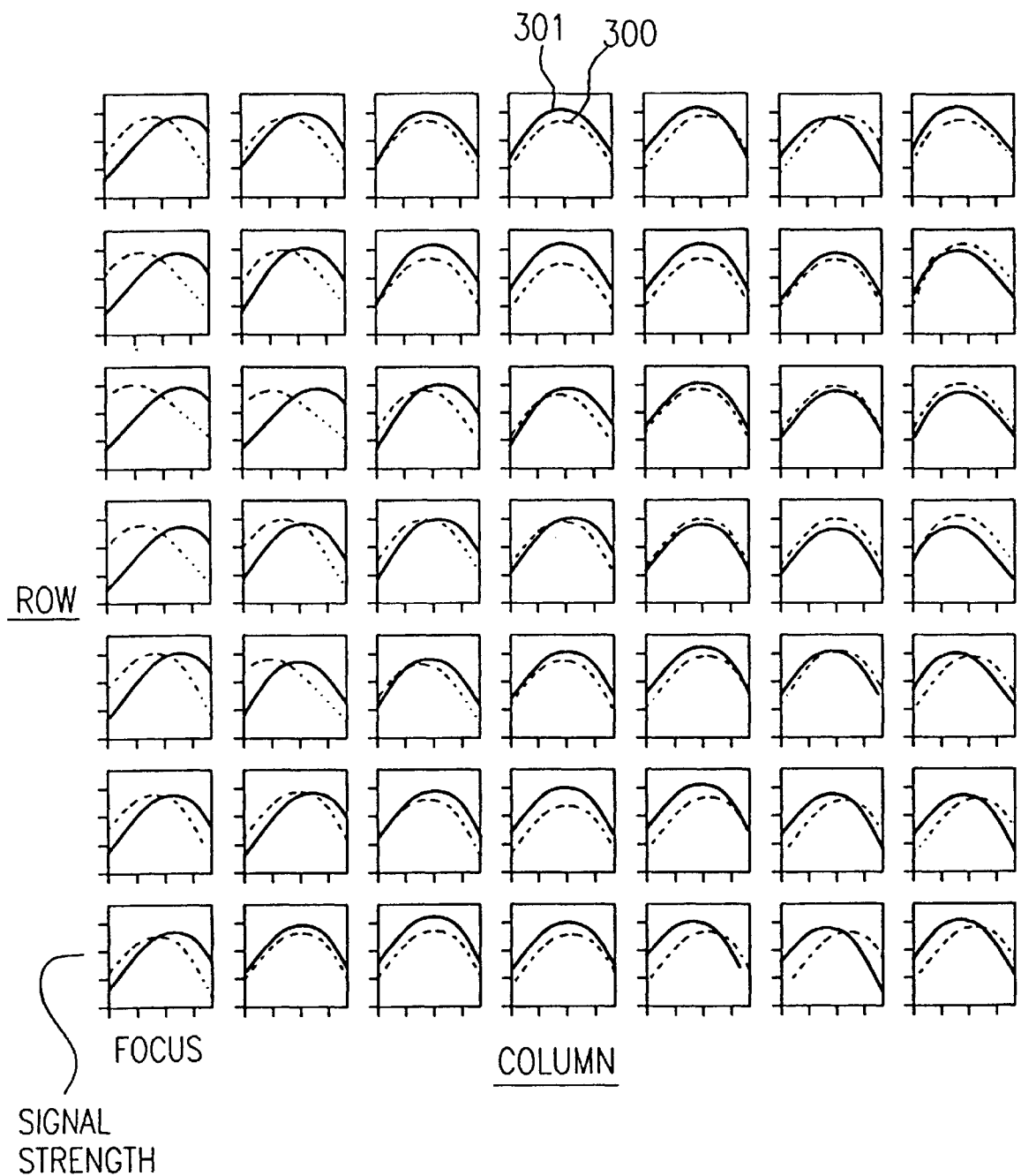

Another illustrative embodiment of the present invention involves a determination of lens field curvature and subsequent lens adjustment if necessary. The field curvature for the lens may also be determined. A focal surface (loosely termed a focal plane) is the conceptual surface of loci of optimum focus values within a printing field. Field curvature (as a component of Seidel aberrations) exists when the focal surface is not truly planar. The procedure for determining average field curvature is as follows. In general terms, a graph analogous to that of FIG. 6 is created for each point of interest (corresponding to a chosen feature group within a sub field array) within a printing field (corresponding to a full field array). FIG. 12 illustrates a typical set of graphs (a 7×7 array corresponding to a full field array) obtained in the aforedescribed manner. For each point in the printing field 41, the average focus between the horizontal and vertical oriented features designated by reference numeral 200 (in FIG. 6) is obtained. Then a surface of best average focus is generated, such as shown in FIG. 7. Thus, FIG. 7 illustrates the average focus offset as a function of sub field array location within the full field array. Each point on the curve of FIG. 7 represents a point in space at which there is equally minimized degradation of horizontal and vertical focus (i.e., known to those in the art and the circle of least confusion).

Concerning FIG. 12 it is important to realize that all of the graphs of the 7×7 full field array were obtained at a fixed exposure dose and for a fixed feature size (i.e., for corresponding feature groups). Should either exposure dose or feature size be varied, the graphs of FIG. 12 may also be expected to change. Should one wish to compare two different lenses, via their full field array graphs akin to FIG. 12, it is important that both sets of 7×7 graphs be obtained at nearly identical conditions including, for example, the same exposure dose and feature size. One may, of course, mathematically adjust a 7×7 set of full field array graphs obtained at a particular exposure dose/feature size to correspond to a different exposure dose/feature size by selecting sufficient points in the full field array and obtaining graphs for a complete range of doses and feature sizes. The graphs for the remaining unselected points may be mathematically scaled. Other variables besides exposure dose and feature size may influence the shapes of these graphs, and these may be treated in a similar manner.

Figure 8:
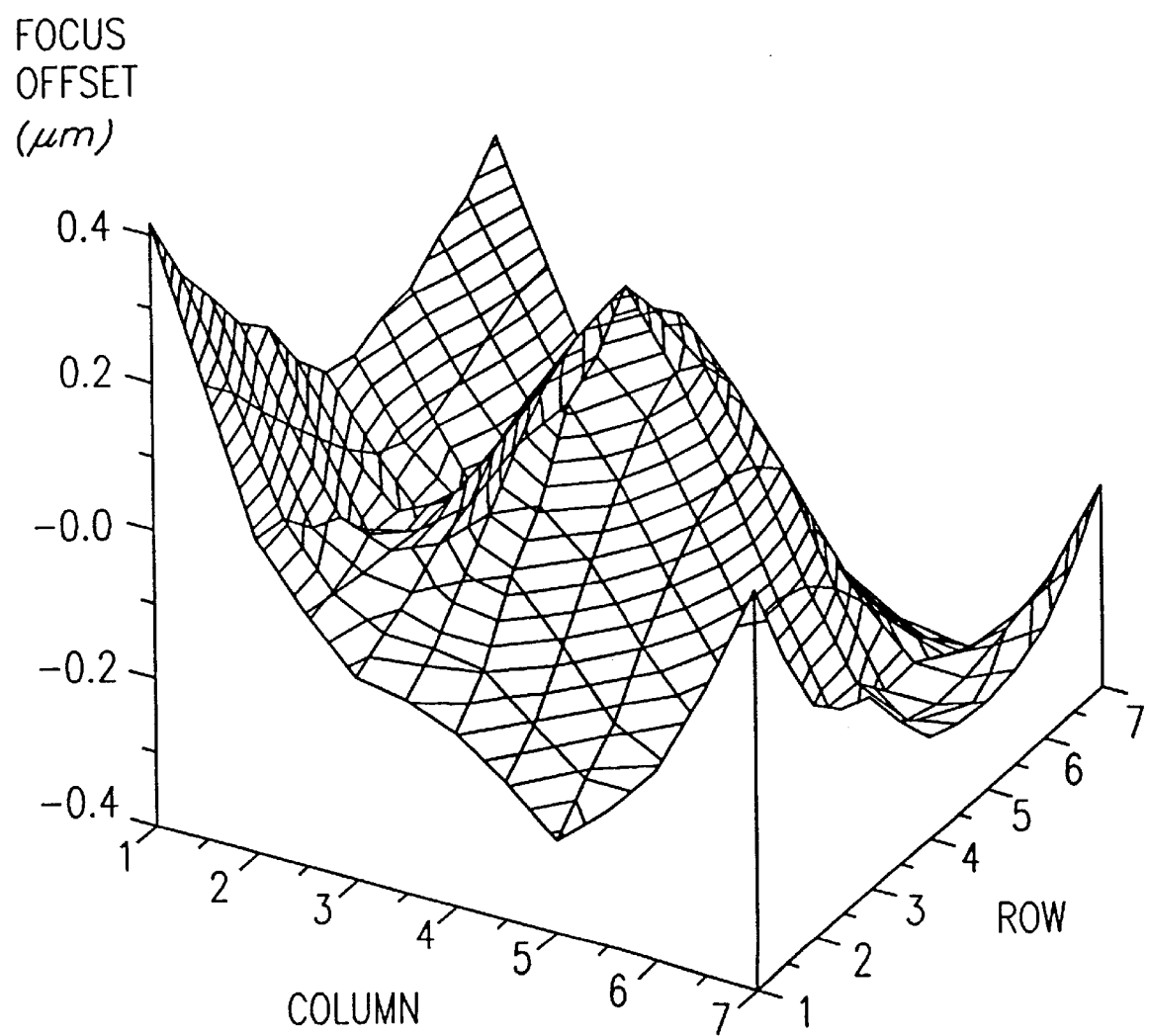
Figure 9:
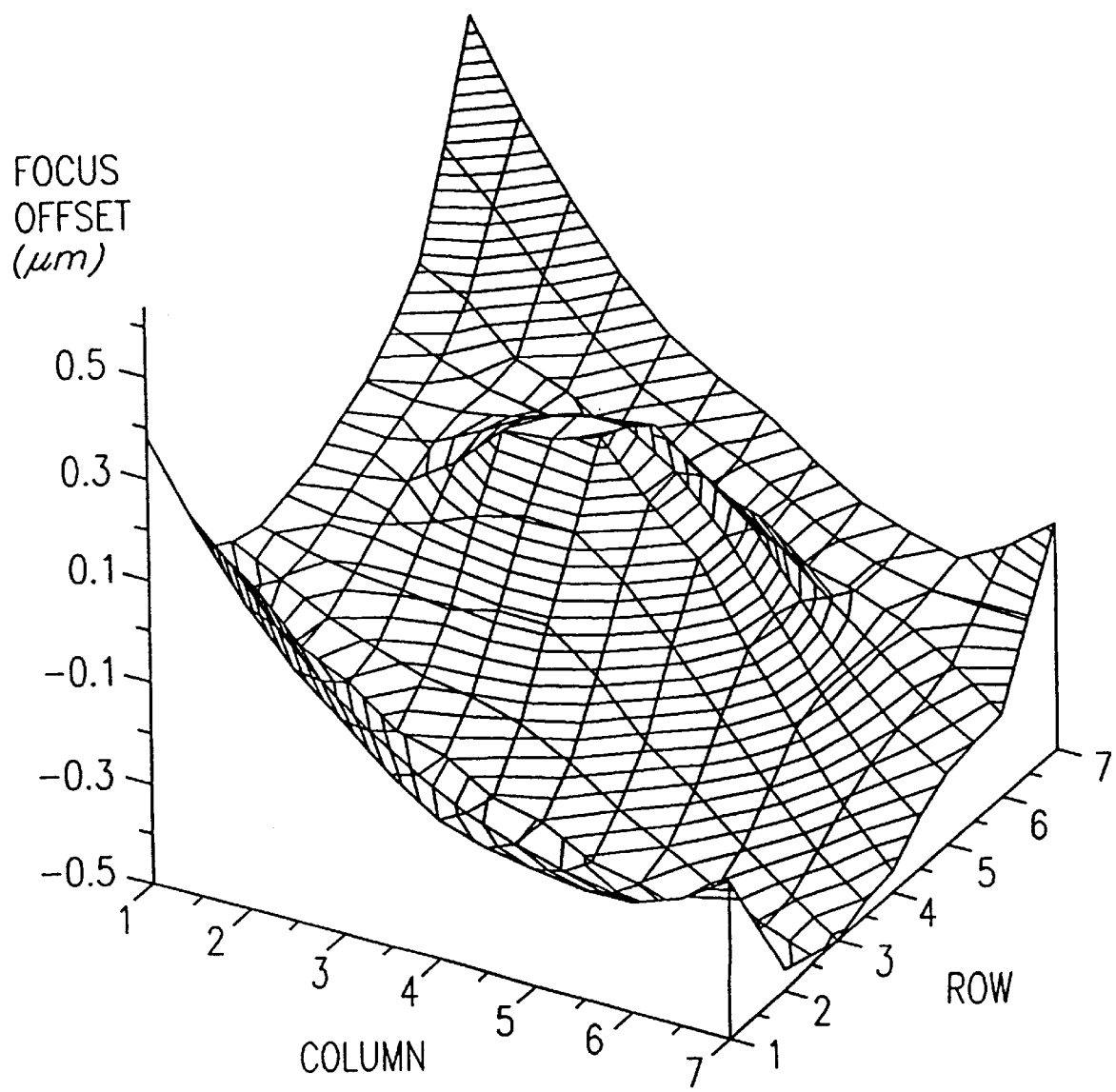

In addition, a separate field curvature for both horizontal and vertical focal surfaces (or other desired feature orientations using suitable conditions) may be produced. Examples are provided in FIGS. 8 and 9. Each of FIGS. 8 and 9 was produced utilizing data analogous to that depicted in FIG. 12 for each of the desired points in the printing field. The data on the surface in FIG. 8 was obtained using the vertical signal strength data, while the curve in FIG. 9 was obtained using horizontal signal strength data. It is instructive to compare FIGS. 7, 8, and 9. FIG. 7 represents, in a sense, an average of FIGS. 8 and 9. In the example depicted here it may be noticed that, comparison of FIGS. 8 and 9 reveals significant astigmatism in the lens. Furthermore, examination of FIGS. 8 and 9 illustrate that the focal surfaces for both the horizontal and vertical directions are not coincident.

Examination of FIG. 12 provides some insight into the characteristics of the lens. Reference numeral 300 (dotted lines) represents $K_H$, while reference numeral 301 represent $K_V$. At the left of the printing field, prominent astigmatism is clearly visible. The astigmatism shifts as one moves from the left columns to the right-most column (i.e., across the lens). Thus, as noted before (in FIGS. 8 and 9) the astigmatic focal planes are not coincident and are typed with respect to each other.

In general terms, the existence of stepper column tilt can be evaluated by looking at the axis of symmetry of the surface depicted in FIG. 7. A tilt in the axis of symmetry of the surface provides an indication that the optical column of the stepper may be tilted. In order to perform the experiment correctly, one must determine in advance whether the chuck is tilted and whether the wafer has a wedge shape. Effects due to wafer wedge may be eliminated by rotating the wafer 90 degrees to make multiple exposures (or by averaging multiple wafers). The stepper column or chuck may then be adjusted to eliminate tilt.

Examination of FIG. 7 shows incomplete corrections for positive and negative lens elements, as displayed by a large concave disk (positive lens) with a field center pushed abruptly up (negative lens). The overall tilt of the optical column is indicated by the tilt of the overall plot.

The effects of astigmatism may be somewhat compensated also. Once astigmatism has been determined, operation of the lithography tool may be improved by adjusting the optical column axis relative to the wafer chuck so that the deviations of the focal surfaces for horizontal focus or vertical focus (i.e., FIGS. 8–9) from the axis of the column are minimized. In addition, should the stepper be a deep UV stepper, astigmatism may potentially be compensated for by adjusting the overall lens operating temperature. It may also be possible to change the lens temperature on any stepper to improve astigmatism.

Field curvature can also be compensated in printing tools which have dynamically reconfigurable chucks. These instruments have pins which are controlled (perhaps piezoelectrically) and which can alter the local flatness of the wafer in response to various preprogrammed commands.

Depth of Focus and Defocus Sensitivity

Another illustrative embodiment includes the determination of depth of focus and/or defocus sensitivity and the adjustment of the lens if necessary. The next few paragraphs will discuss the methods for measuring depth of focus and defocus sensitivity. A few terms will be defined first. The depth of focus is occasionally defined as that range of focus over which an array of uniformly spaced lines and spaces in developed resist do not exhibit scum. Two other definitions for depth of focus which will be useful are: a) depth of focus is the focus range over which a predetermined wall angle may be created in the photoresist, and b) depth of focus is that focus range (i.e., the amount of defocus on either side of best focus) over which one can maintain an ideal linewidth within a predetermined percentage (such as 10%). The latter definition has been accepted by many versed in the art, but many have also recognized the former definition (i.e., wall angle). Quite a number of other definitions of depth of focus are also possible, although we need not go into all of them here.

The term defocus sensitivity will also be used in the following discussion. Defocus sensitivity may be defined as the curvature of a signal strength curve, such as that depicted in FIG. 6. Defocus sensitivity is a number which indicates the rate of change of signal strength as a function of defocus (i.e., change in focus from an optimum value). The following procedure will describe how one may measure relative defocus sensitivity, i.e., the defocus sensitivity of one point in the printing field compared with the defocus sensitivity of another point in the printing field. For each point in the printing field of interest, a set of signal strength curves similar to that depicted in FIGS. 6, 12 may be obtained. The mathematical curvature of both the horizontal and vertical signal strength curves may be calculated for each point and then compared. It will be noted that defocus sensitivity determined in this manner may be different at a given point in the printing field for horizontal and vertical directions, and in fact may be different for any arbitrary orientation.

The relative defocus sensitivity (i.e., for fixed exposure dose, feature size, etc.) may be measured for a selected number of locations in the printing field. For example, referring to FIG. 10, assume that three locations in the printing fields designated A, B, and C have been selected. The locations A, B, and C may either be observations of step-function-like transitions from exposed to unexposed regions in a photoactive material or they may be a series of spaced lines and spaces of predetermined size and orientation. For each of these selected locations, a signal strength curve (without reference at the moment to whether the curve represents average, or horizontal, or vertical features) is obtained. Each of the curves in FIG. 10 indicates signal strength as a function of focus for the three selected locations A, B, and C. For simplicity, it will be assumed for the moment that the maximum observed signal strength for each of the three locations, A, B, and C is the same.

Figure 10:
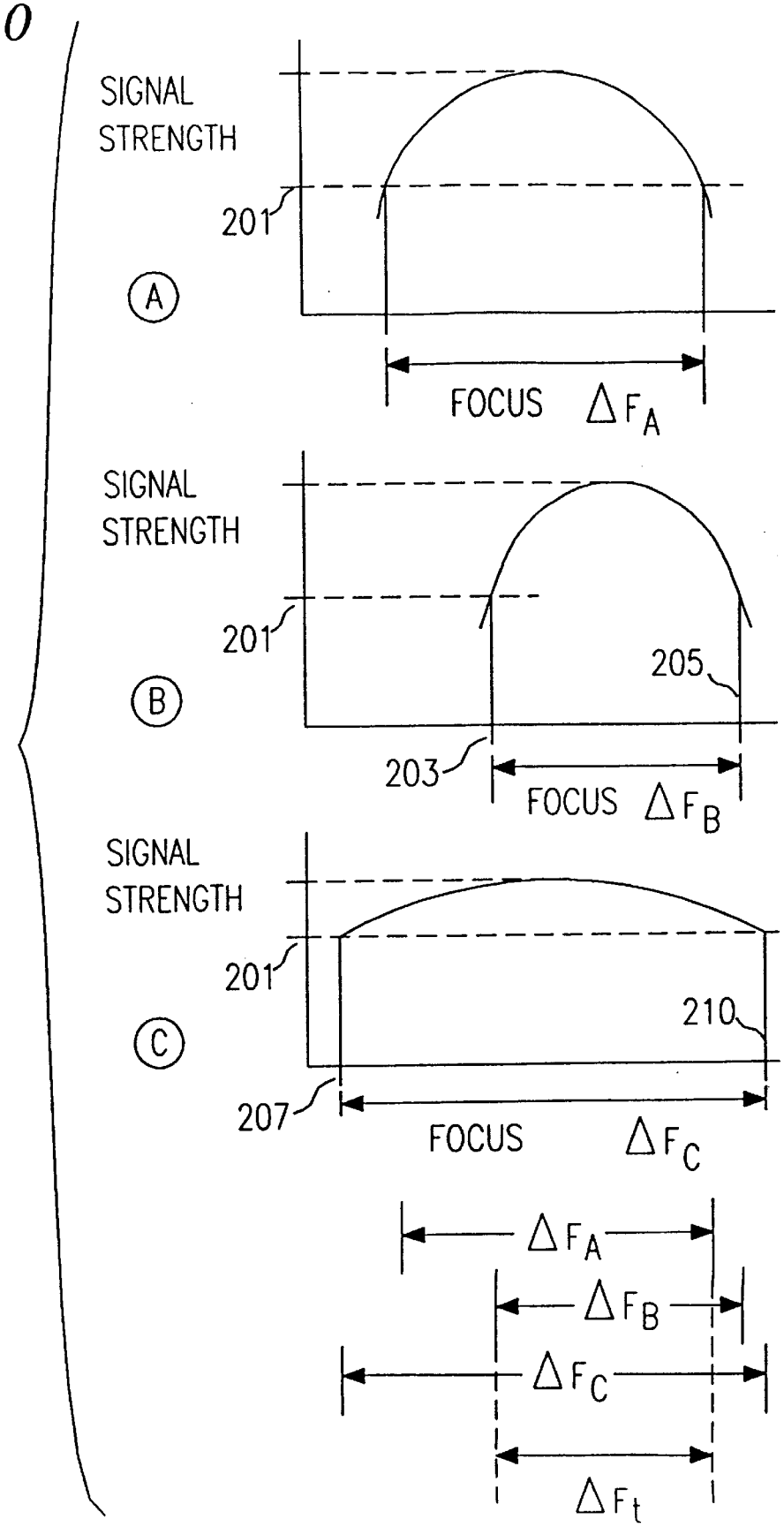

Examination of the graphs of FIG. 10 reveals that each curve has a different curvature. Thus, the rate of degradation of the image as a function of defocus is different for each location, A, B, or C. The numerical value of the curvature is a metric by which defocus sensitivity for a given location, A, B, or C, may be judged.

For the determination of effective depth of focus, it will be supposed that the maximum tolerable degradation in signal strength is given by reference numeral 201 on the graphs. This degradation level is determined by experience or by reference to the existing process. Examination of graph B indicates that the allowable defocus may be measured between points designated by reference numerals 203 and 205. The width of the defocus sensitivity in graph B will be designated $\Delta F_B$. Turning to graph C, the same value for signal strength degradation designated by reference point 201 is noted on the defocus curve and the allowable range of defocus between reference numerals 207 and 210 designated $\Delta F_C$ is measured. A similar procedure based upon maximum allowable signal strength degradation in graph A produces defocus $\Delta F_A$. (In practice it is often advisable to include more than 3 field points and feature orientations.) Examination and comparison of the graphs of FIG. 10 indicates that the total allowable defocus (including field curvature, astigmatism, and contributions from all other image degrading aberrations) is therefore established by the region of overlap in which all signal strength curves, A, B, C, . . . simultaneously remain above the required value 201. Hence the effective depth of focus for the particular lens under examination is $\Delta F_t$ (as illustrated in FIG. 10). This comprehensive defocus quantity $\Delta F_t$ therefore establishes the lens component of the defocus budget. Consequently, the lithographer, when attempting to print over devices having severe topography, may determine the focus budget by considering the quantity $\Delta F_t$ and subtracting from it the topography value, wafer flatness, chuck flatness, focus tracking inaccuracies, etc.

The technique permits evaluation of depth of focus for a variety of different lithographic patterns. For example, variably sized lines and spaces may be examined under the present technique to determine what the tool is capable of printing. This provides guidance to the circuit designer in terms of determining design rules for example.

Latent Images Over Topography

Another illustrative embodiment involves the determination of various quantities such as defocus sensitivity or relative resolution over topography. The aforedescribed technique may be also applied to determine defocus sensitivity and relative resolution upon exemplary product with existing topography. When determining defocus sensitivity over product wafers with existing topography, it is advantageous to collect and spatially resolve light scattered from the topography through an unpatterned photoresist. Then an appropriate latent image is created in the photoresist. Light scattered from the latent images is measured and may also be spatially resolved. The first signal from the topography is subtracted from the signal from the latent image, thus yielding true latent image scattering intensity data set akin to that discussed above. Suitable devices for spatially resolving scattered light mentioned above include: a mechanically movable detector and incident beam, a CCD (charge coupled device) two-dimensional array placed above the wafer or remote from the wafer and optically coupled to the wafer, a vidicon, orthicon, nuvicon (e.g., a television-like camera), a microchannel plate with photocathode and anode array behind, or other suitable two-dimensional X-Y addressable detectors. Thus, re-interpreting FIG. 4 a bit, reference numeral 187 may represent at least a part of a two-dimensionally addressable detector which may, if desired, actually surround energy source 181. Thus, reference numeral 187 may be a mechanically movable detector, a CCD two-dimensional detector array, etc. The two-dimensional detector may be utilized to measure latent image scattered energy at those points where the latent image scattered intensity is not unduly affected by energy scattered from the underlying topography.

Lens Resolution

Another illustrative embodiment involves the determination of lens resolution and subsequent lens adjustment if necessary. The following paragraphs will discuss lens resolution, how lens resolution may be measured, and how the information may be used to enhance product fabrication. Returning to FIG. 10, it will be noted that the maximum amplitude of the signal strength curves may conceivably be different for sample points A, B, and C. There are various definitions of "resolution" used by those skilled in the art. Whatever definition is chosen, the amplitude of the signal strength curve in FIG. 10 (i.e., the scattered signal) magnitude is closely correlated to lens resolution.

Lithographic Tool Comparison

Another illustrative embodiment includes the evaluation of lens characteristic(s) for at least two lithography tools and subsequently choosing the proper tool for a particular task. Using suitable features, examination of signal strength curves obtained for various selected points in a printing field (using varying focus and exposure ranges for each point), permits one to determine at which point(s) in the printing field the signal strength is relatively optimum (or at least acceptable). The relative data on resolution for a particular feature may be related to a physically developed feature in a given resist formulation and processing scheme. Different lenses or steppers may then be absolutely compared by examining at least one developed image (via SEM) of one point in the fields of both lenses. Then other points in the fields of both steppers may be compared by comparison of their respective signal strength curves. Thus the above-mentioned technique permits one to find out the lithographic capabilities of a particular stepper. Should a given semiconductor fabrication process require a given minimum signal strength level for a specified focus range, the survey of various points in the printing field mentioned above will aid in determining what portions(s) of the printing field may be used for the given semiconductor fabrication process.

Wafer Production

Another illustrative embodiment includes the evaluation of a selected lithographic parameter (e.g., focus, exposure) in latent images formed on product wafers using a desired portion of the product reticle or a separate test reticle. The the proper parameter is chosen, so that additional latent images may be formed using a product reticle, if desired. The product reticle latent images are then developed and the underlying material processed according to known techniques. The following paragraphs will explain how accurate exposure may be chosen over product wafers. In current practice, an exposure array (full field without sub field arrays using a product reticle) is often shot over product at varying exposures with a fixed focus. For each row on the wafer the focus is changed. Each column has fixed focus and varying exposure. Then the wafer is post-exposure processed and developed. Then the wafer is either put into an optical metrology tool or analyzed by SEM. Then the dimensions of a linewidth control feature in each printing field are measured. Then a printing field is chosen in which the linewidth control feature has the proper line size and profile. The associated focus and exposure are selected. Future wafers are then processed at the selected exposure and focus. The test wafer may be then reworked and reprocessed at the chosen focus and exposure. The process is labor intensive and time consuming and may often take as long as 40 or 45 minutes. The present inventive technique offers a variety of advantages over past techniques including speed. The present inventive technique may require as little as five minutes to determine both focus and exposure.

Figure 11:
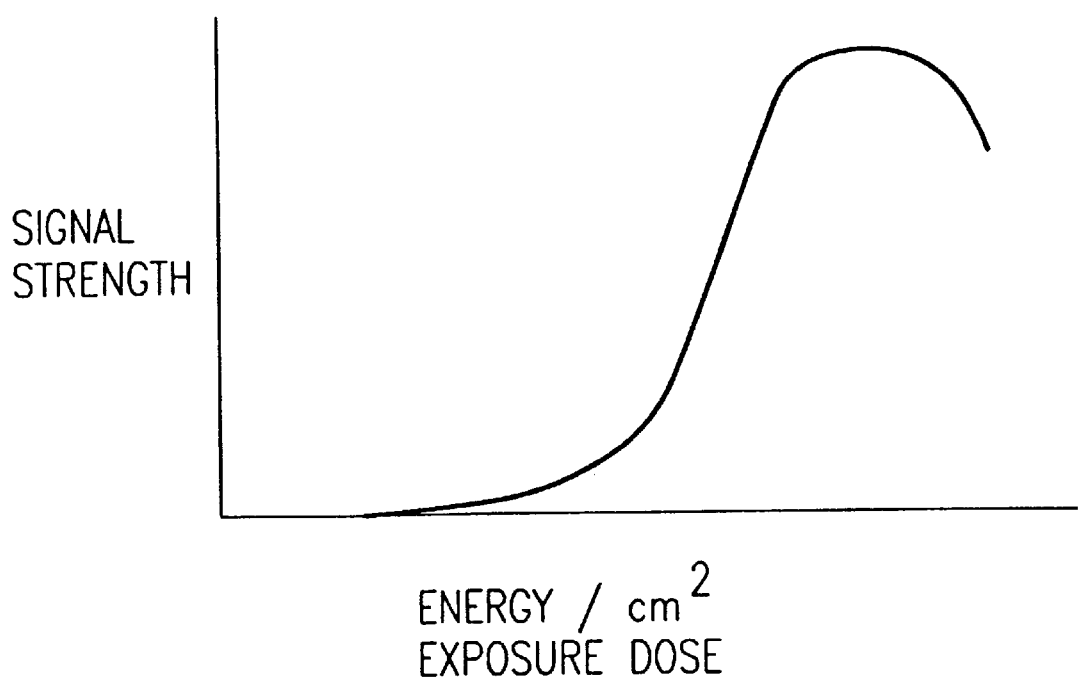

In the present procedure, a series of features at varying exposure and focus are printed in an area near or within the printing field on a product wafer using either the product reticle or a separate reticle. The features may be in the streets, scribe lines within the chip area, or near the product pattern area. The undeveloped latent image is interrogated as described before. The best focus is determined in a manner analogous to choosing machine focus (using only the features in the street, scribe lines, within the chip area or near the product pattern, and not a full field array). Preferably at best focus (chosen in accord with the previously described procedure), the signal strength of the individual features may be plotted against exposure dose yielding a curve resembling that in FIG. 11. It will be noted that at essentially zero exposure there is an unbleached image, i.e., zero signal. As exposure dose is increased, signal strength tends to rise quasi-linearly, then approaching maximum value it saturates and may fall again with overexposure. The data depicted in FIG. 11 is for very large features, those in which proximity effects are minimal. The signal strength data from FIG. 11 is compared with a look-up table (determined by experience for a particular resist process) that contains signal strength versus developed line size. Consequently, for a given desired developed line size the optimum exposure dose can be obtained. It will be noted that the look-up table is probably best obtained empirically since it depends upon the development process. If the development process should change, a different look-up table relating signal strength to developed line size must be obtained. The foregoing procedure has been described in terms of layer isolated features which are not affected by proximity effects. As integrated circuit geometries shrink, it will become desirable to print closely-spaced lines and spaces. Nevertheless, the procedure described above remains the same. The results may be a bit different. Thus, the procedure described above may be repeated for each layer used in building the integrated circuit. Consequently, optimum exposure at best focus may be chosen for each layer. An advantage of this technique is that it self-compensates for variations in the material levels created by previous process steps or any part of the process affecting the exposure. Each earlier material layer may reflect light in a different manner. However, these reflections show up in terms of different signal strength dependencies for each layer. What is measured in FIG. 11 is the actual chemical image or the gradient in the photoactive compound, which has been formed in the resist. Consequently, what is measured includes the effects of reflections from lower layers in the film stack topography.

In actual semiconductor fabrication, it often happens that individual material layers have non-uniform thickness across the wafer and/or wafer-to-wafer. The non-uniformity of underlying layers means that each layer may have varying indices of refraction, absorption, and reflection. Hence, proper exposure doses over layers with varying thickness may be accurately determined by continuously measuring the light scattered from the latent image in the resist as the image forms.

The illustration of FIG. 4, if the components are re-interpreted a bit, illustrates the procedure. Reference numeral 181 may designate (instead of an interrogation beam, as before) the stepper exposure beam. Detector 187 monitors the signal strength of light scattered from latent image 133 as it forms. When the signal strength reaches a predetermined value, detector 187 creates a signal which turns off exposure beam 181. Thus, the best exposure may be chosen for each layer printed at multiple locations on the wafer.

Spherical Aberration

Another illustrative embodiment of the present invention includes the determination of lens spherical aberration and subsequent lens adjustment if necessary. Another lens characteristic which may be quantitatively measured is spherical aberration. Spherical aberration is a phenomenon in which rays traversing the central portion of a lens are found to focus at a different axial position than marginal rays that traverse the outer portion of the lens. To some extent lens shapes in a complex lens may be chosen to correct spherical aberrations. It is well known in the art that spherical aberration occurs, however, in many lens systems. Therefore, in terms of equipment evaluation and acceptance tests, and also characterization (i.e., rank order) of equipment in a production line, it is important to be able to evaluate spherical aberration.

Spherical aberration may be evaluated by using techniques somewhat similar to that discussed above. The techniques for obtaining optimum focus for features at one or more points in the printing field are performed. A sequential addition of suitably sized and positioned annular and circular apertures (placed, for instance, near the entrance pupil of the reduction lens) between full field array exposures is performed.

A quantitative determination of spherical aberration may be made by finding the changes in focus for the above-mentioned points as a function of which apertures are in place. The information may be used to re-assemble or fabricate the lens. Alternatively, resolution, field curvature, column tilt, spherical aberration, astigmatism, and coma data may be used to rank order steppers in a clean room. Thus, a certain stepper may be quantitatively characterized and, if necessary, relegated for use in non-critical process levels.

Coma

Another illustrative embodiment of the present invention includes the determination of lens coma and the subsequent adjustment of the lens if necessary. It may also be noted that many graphs in FIG. 12 have unequal signal peak heights. By visually noting the heights of the vertical plots 301, while moving through the center column from top to bottom and back, it may be seen that for vertical features there is little variation in signal strength. However, for horizontal plots 300, the signal strength changes dramatically relative to the verticals. Similarly, as one notes the horizontal plots 300 while moving left to right across the central row, it will be noted that the vertical plots 301 change dramatically relative to them.

This particular variation across the image field is characteristic of Seidel aberration coma. A quantitative defocus value for a given feature or resolution may be ascribed to each of the field locations which lie along the horizontal or vertical axis.

Barometric Pressure

Another illustrative embodiment of the present invention involves measuring daily barometric pressure and comparing it with a machine focus offset induced by pressure changes. The comparison provides a look-up table so that machine focus offset may be determined from the table and a barometer at later times, or the lithography tool may be automatically corrected. The present technique may also be used to determine machine focus offset on a daily basis and compare it with barometric pressure. The result is a generally straight line. Subsequent machine focus determination can take the barometric pressure data into account from a lookup table.

Thus, in general terms, interrogation of latent images (which may be formed in an energy sensitive material exposed to energy in the form of electromagnetic radiation, x-rays, electrons, ions, neutral particle beams, etc.) by measuring energy scattered from the latent image provides information which may be utilized to:

a) choose critical lithographic parameters (i.e., focus exposure) during semiconductor integrated circuit fabrication;

b) adjust lithographic tools by evaluating lens system parameters (e.g., astigmatism, defocus sensitivity, depth of focus, resolution, field curvature, spherical aberration, coma, other aberration, etc.) and then adjusting the lens system (e.g., by moving elements, adding elements, re-grinding elements, re-coating elements, or other techniques known to those skilled in the art).

c) derive maximum utilization from lithographic tools by quantitatively evaluating them and then ranking them.

In addition, an inventive method of interrogation has been disclosed and an inventive latent image array pattern disclosed.

I claim:

1. A method of lithography tool adjustment comprising:
   providing a lens system;
   providing a substrate having a resist;
   creating a latent image in said resist;
   interrogating said latent image to thereby determine a lens system parameter;
   adjusting said lens system or lithography tool to improve said parameter.

2. The method of claim 1 in which said lens system parameter is chosen from the group consisting of astigmatism, defocus sensitivity, depth of focus, resolution, coma, spherical aberration, and field curvature.

3. A method of lithography tool adjustment comprising:
   providing a lens system having a printing field;
   providing a substrate having a resist;
   forming at least two sets of pluralities of latent images, each plurality having a set of lines parallel to a lens radius and a set of lines perpendicular to said lens radius in said resist, each said latent image having an associated focus;
   interrogating each said latent image to determine its scattered energy as a function of its respective focus;
   in each plurality of images, for each set of parallel latent images and each set of perpendicular latent images, determining the respective maximum scattered energy;
   determining the maximum amount of defocus required to make the scattered energy from each set of parallel latent images nearly equal to the scattered energy from each set of perpendicular latent images, said maximum amount being here termed coma;
   adjusting said lens system to reduce said coma.

4. A method of lithography tool adjustment comprising:
   providing a multi-element lens system;
   providing a substrate having a resist;
   forming a multiplicity of pluralities of latent images in said resist, said multiplicity spanning a substantial portion of the printing field of said lens system, each of said pluralities being associated with a location in the said printing field;
   interrogating each said plurality of latent images to determine a preferred focus associated with each plurality;
   said preferred focuses being associated with locations in said printing field and defining a field curvature surface;
   adjusting said lens system to make said surface of preferred focus flatter.

5. The method of claim 4 wherein said lens system is exposed to incident energy starting at a first time and ending at a second time, and said field curvature surface is determined for both said first time and said second time.

6. The method of claim 4 wherein the temperature of said lens system is permitted to rise from a first temperature to a second temperature, and a said field curvature surface is determined for both said first temperature and said second temperature.

7. A method comprising:
   providing a substrate, having a resist, to a lithography tool;
   forming a full field array having first elements of latent images in said resist; each first element of said full field array being a sub field array having second elements; each second element of said sub field array being a feature clump having third elements; each element of said feature clump being a feature group having fourth elements; each feature clump being characterized by at least one predetermined lithographic parameter;
   interrogating selected feature groups to measure scattered energy;
   displaying for each sub field array the scattered energy of each said feature group as a function of the associated lithographic parameter of its respective feature clump;
   adjusting said lithography tool so that the said scattered energies of selected feature groups tend towards a desired value.

8. The method of claim 7 in which each of said feature groups is characterized by a different linewidth.

9. The method claim 7 in which each said full field array is a 7×7 array.

10. The method of claim 7 in which each said sub field array is a 4×4 array.

11. The method of claim 7 in which said lithographic parameter is chosen from the group consisting of focus and exposure.

* * * * *